(12) United States Patent
Park et al.

(10) Patent No.: US 7,612,428 B2
(45) Date of Patent: Nov. 3, 2009

(54) INDUCTOR FABRICATED WITH DRY FILM RESIST AND CAVITY AND METHOD OF FABRICATING THE INDUCTOR

(75) Inventors: Hae-seok Park, Yongin-si (KR); In-sang Song, Seoul (KR); Hyung Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 478 days.

(21) Appl. No.: 11/291,894

(22) Filed: Dec. 2, 2005

(65) Prior Publication Data

US 2006/0192267 A1 Aug. 31, 2006

(30) Foreign Application Priority Data

Dec. 3, 2004 (KR) .................. 10-2004-0101068

(51) Int. Cl.
*H01L 29/00* (2006.01)
(52) U.S. Cl. ..................................... 257/531
(58) Field of Classification Search ........... 257/531, 257/532, E21.573, E27.046, E21.022, E23.021, 257/E23.146
See application file for complete search history.

(56) References Cited

U.S. PATENT DOCUMENTS 5,844,299 A 12/1998 Merrill et al.
6,492,708 B2 * 12/2002 Acosta et al. ............... 257/531

FOREIGN PATENT DOCUMENTS

KR 2001-0067188 A 7/2001
KR 2003-0092380 A 12/2003

* cited by examiner

*Primary Examiner*—Thomas L Dickey
*Assistant Examiner*—Fazli Erdem
(74) *Attorney, Agent, or Firm*—Sughrue Mion, PLLC

(57) ABSTRACT

An inductor fabricated with a dry film resist and a cavity and a method of fabricating the inductor. The cavity can be formed in a substrate to minimize a parasitic capacitance generated by structures of upper electrodes, an insulating layer, and a lower electrode and minimize energy loss caused by an eddy current generated through the substrate. Also, a process of forming and planarizing the cavity can be simplified so as to form the cavity to a sufficient depth. As a result, an inductor having a high quality factor and a high self resonant frequency can be fabricated. Also, a scheme for simply forming and planarizing a cavity is contemplated.

10 Claims, 4 Drawing Sheets

INDUCTOR FABRICATED WITH DRY FILM RESIST AND CAVITY AND METHOD OF FABRICATING THE INDUCTOR

CROSS-REFERENCE TO RELATED APPLICATIONS

This application claims priority from Korean Patent Application No. 2004-101068, filed Dec. 3, 2004, in the Korean Intellectual Property Office, the disclosure of which is incorporated herein by reference.

BACKGROUND OF THE INVENTION

1. Field of the Invention

The present invention relates to an inductor fabricated with a dry film resist (DFR) and a cavity formed between an insulating layer and a lower electrode so as to have a high self resonant frequency (SRF) and a high quality factor Q.

2. Description of the Related Art

An inductor has a space limitation in a wireless circuit area. Thus, a spiral inductor drawing a concentric circle in one direction using a pattern is mainly used. The spiral inductor is wound in the same direction to increase a magnetic field. Thus, although the spiral inductor has a small size, the spiral inductor forms an inductance having a large value.

For an integrated circuit used for a wireless circuit, the spiral inductor is applied in a frequency band between 800 MHz and 2400 MHz in various fields.

FIG. 1 is a cross-sectional view of a conventional spiral inductor. Referring to FIG. 1, in an inductor 100, a metal layer 20 that is a lower electrode is stacked on a substrate 10, and an insulating layer 30 is deposited on the metal layer 20. Viaholes 40 and 50 are formed in the insulating layer 30.

An upper electrode 60 that is patterned in a spiral shape is formed on the insulating layer 30. The upper electrode 60 is connected to the lower electrode 20 underneath the insulating layer 30 via the viaholes 40 and 50.

According to the structure of the inductor 100, energy loss occurs due to an eddy current generated through the substrate 10 by the spiral structure of the upper electrode 60 and a resistance component of the substrate 10. Also, a parasitic capacitance component generated by the structures of the upper electrode 60, the insulating layer 30, and the lower electrode 20 may not be neglected.

A quality factor Q indicating the quality of an inductor is obtained by dividing magnetic energy stored in the inductor by lost energy. Energy loss occurs due to resistances of a metal line and a silicon substrate. As a frequency is increased by a skin effect, the resistance of the metal line is increased. Also, energy loss of the silicon substrate is increased with the increase in the frequency. Also, the magnetic energy is decreased with the increase in the frequency. Energy generated by the parasitic capacitance component caused by the shape of the inductor is increased with the increase in the frequency. Thus, the quality factor Q has a maximum value at a specific frequency and then gradually decreases.

Also, the magnetic energy gradually decreases and the energy generated by the parasitic capacitance component increases with the increase in the frequency. Thus, the inductor loses its function but operates as a capacitor so as to generate an SRF.

To solve these problems, an insulating layer is formed of a material having a low dielectric constant to reduce a parasitic capacitance between upper and lower electrodes. Also, the thickness of the insulating layer is increased to reduce the parasitic capacitance between the upper and lower electrodes. However, this has a limit, and energy loss of a substrate is not removed.

In a conventional inductor disclosed in U.S. Pat. No. 5,844,299 and entitled "Integrated Inductor," a substrate under an inductor is removed to reduce an effect of the substrate. However, the parasitic capacitance between upper and lower electrodes cannot be reduced. Also, to remove the substrate, a cavity is formed, filled with a thick silicon oxide material, and planarized using a method such as lapping and chemical mechanical polishing (CMP). Thus, a process of fabricating the conventional inductor is complicated.

Accordingly, a method of simultaneously removing energy loss due to a substrate and a parasitic capacitance between upper and lower electrodes is required.

SUMMARY OF THE INVENTION

Accordingly, the present general inventive concept has been made in view of the above-mentioned problems, and an aspect of the present general inventive concept is to provide an inductor fabricated with a DFR of which an insulating layer is formed between upper and lower electrodes and a cavity formed between the insulating layer and the lower electrode so as to have a high quality factor Q and a high SRF, and a method of fabricating the inductor.

According to an aspect of the present invention, there is provided an inductor including: a lower electrode; a substrate including a cavity with a bottom along which the lower electrode is patterned, the cavity being formed in a predetermined area of the substrate except portions of the substrate in which ends of the lower electrode are formed; an insulating layer formed on the substrate so as to cover the cavity and including at least one viahole contacting the ends of the lower electrode; and upper electrodes formed in a spiral shape on the insulating layer and respectively connected to the ends of the lower electrode via the at least one viahole.

The cavity may be formed in an area of the substrate opposite to the upper electrodes except a portion in which the at least one viahole is formed.

The insulating layer may be formed of a dry film resist using a roller and strengthened using whole surface exposing and thermal treating.

The at least one viahole may be formed using an ion beam etching method or a chemical photolithography etching method.

The upper electrodes may be formed using a method of depositing and etching a metal layer or an electro plating method.

The lower electrode may be formed using a patterning method using a spray coater or a deposition method using a shadow mask.

According to another aspect of the present invention, there is provided a method of fabricating an inductor including: forming a cavity in a predetermined area of a substrate; patterning a lower electrode along a bottom of the cavity; forming an insulating layer on the substrate so as to cover the cavity; forming viaholes in the insulating layer to be connected to ends of the lower electrode; and forming upper electrodes in a spiral shape on the insulating layer so that the upper electrodes are connected to the lower electrode through the viaholes.

The cavity may be formed in an area of the substrate opposite to the upper electrodes except a portion in which the at least one viahole is formed.

The insulating layer may be formed of a dry film resist using a roller and strengthened using whole surface exposure or thermal treating.

The at least one viahole may be formed using one of an ion beam etching method and a chemical photolithography etching method.

The upper electrodes may be formed using one of a method of depositing and etching a metal layer and an electro plating method.

The lower electrode may be formed using one of a patterning method using a spray coater and a deposition method using a shadow mask.

BRIEF DESCRIPTION OF THE DRAWINGS

The above aspects and features of the present invention will be more apparent by describing exemplary embodiments of the present invention with reference to the accompanying drawings, in which.

Figure 1:
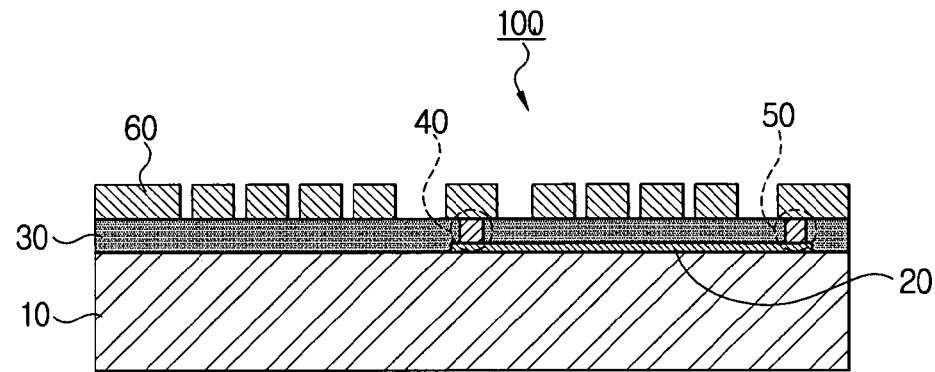
FIG. 1 is a cross-sectional view of a conventional spiral inductor.

DETAILED DESCRIPTION OF THE ILLUSTRATIVE, NON-LIMITING EMBODIMENTS OF THE INVENTION

Certain embodiments of the present invention will be described in greater detail with reference to the accompanying drawings.

In the following description, the same drawing reference numerals are used for the same elements even in different figures. The matters defined in the description such as a detailed construction and elements are provided to assist in a comprehensive understanding of the invention. Thus, it is apparent that the present invention can be carried out without those defined matters. Also, well-known functions or constructions are not described in detail since they would obscure the invention in unnecessary detail.

Figure 2:
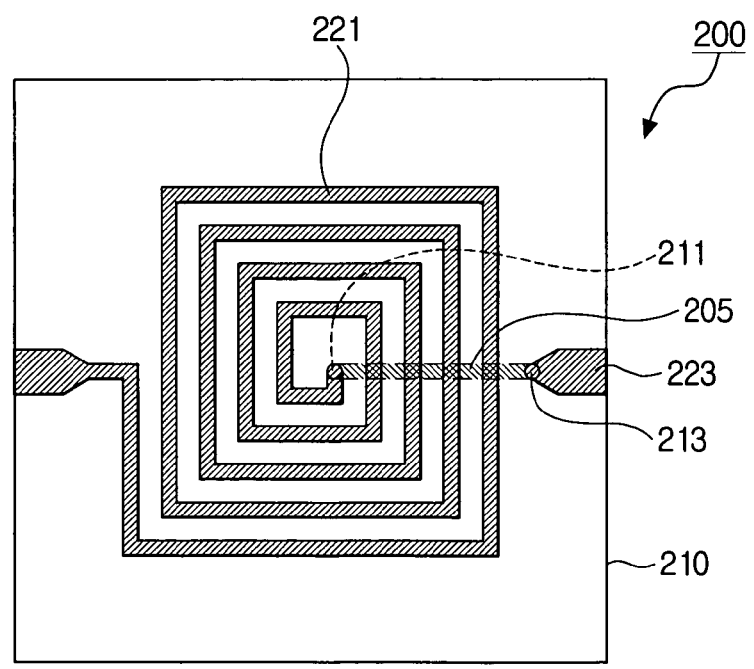
FIG. 2 is a plan view of an inductor fabricated with a DFR and a cavity according to an exemplary embodiment of the present invention.

FIG. 2 is a plan view of an inductor fabricated with a DFR and a cavity according to an exemplary embodiment of the present invention.

Figure 3:
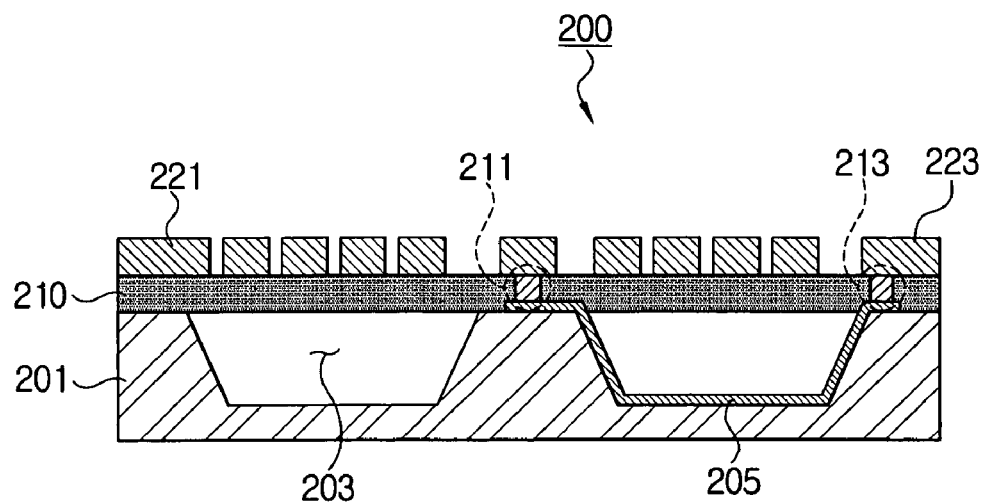
FIG. 3 is a cross-sectional view of an inductor fabricated with a DFR and a cavity according to an exemplary embodiment of the present invention.

In an inductor 200 according to the present invention, a cavity 203 is formed in a substrate 201 to reduce a cross-section and a size of the substrate 201 so as to reduce energy loss from the substrate 201 (see FIG. 3). Also, a parasitic capacitance among first and second upper electrodes 221 and 223 and a lower electrode 205 is reduced so as to increase a quality factor Q.

Referring to FIG. 2, the inductor 200 includes the first electrode 221 patterned in a spiral shape on an insulating layer 210 and the second electrode 223 formed beside the first electrode 221. The first and second electrodes 221 and 223 are connected to the lower electrode 205 formed underneath the insulating layer 210 via first and second viaholes 211 and 213.

The first and second electrodes 221 and 223 and the lower electrode 205 may be patterns having predetermined widths.

FIG. 3 is a cross-sectional view of the inductor fabricated with a DFR and a cavity according to an exemplary embodiment of the present invention. The same reference numerals of FIG. 3 as those of FIG. 2 denote like elements.

Referring to FIG. 3, the inductor 200 includes the cavity 203 formed in a predetermined area of the substrate 201.

The cavity 203 is formed in the predetermined area of the substrate 201 except a support structure of the substrate 201 supporting an insulating layer 210 on the cavity 203. The support structure may be formed at a center and an edge of the substrate 201.

The lower electrode 205 is patterned along an upper portion of the substrate 201 that is a bottom of the cavity 203 so as to connect the support structure in the center of the substrate 201 and a portion of the edge of the substrate 201. Also, the insulating layer 210 is deposited on the substrate 201 to cover the cavity 203.

The insulating layer 210 may be a DRF used to form a circuit during the manufacture of a high density, high integrated circuit board such as a printed circuit board (PCB), a semiconductor substrate, or the like.

According to another aspect of the present invention, an insulating layer is formed of a DFR, and then an insulating layer is further formed of a heterogeneous or homogeneous insulating material so as to secure the structural stability of the insulating layer 210.

As described above, the insulating layer 210 is formed of the DRF to cover the cavity 203 in which the lower electrode 205 is formed, so as to insulate the upper electrodes 221 and 223 from the lower electrode 205. Also, a subsequent process can be simplified.

First and second viaholes 211 and 213 may be formed at a center and an edge of the insulating layer 210 so as to be connected to the lower electrode 205.

The first upper layer 221 is patterned in a spiral shape from a portion of an upper surface of on the insulating layer 210 based on the first viahole 211. The first electrode 221 is connected to an end of the lower electrode 205 via the first viahole 211, and an other end of the lower electrode 205 penetrates through the insulating layer 210 and then is connected to the upper electrode 223 via the second viahole 213.

Figure 4:
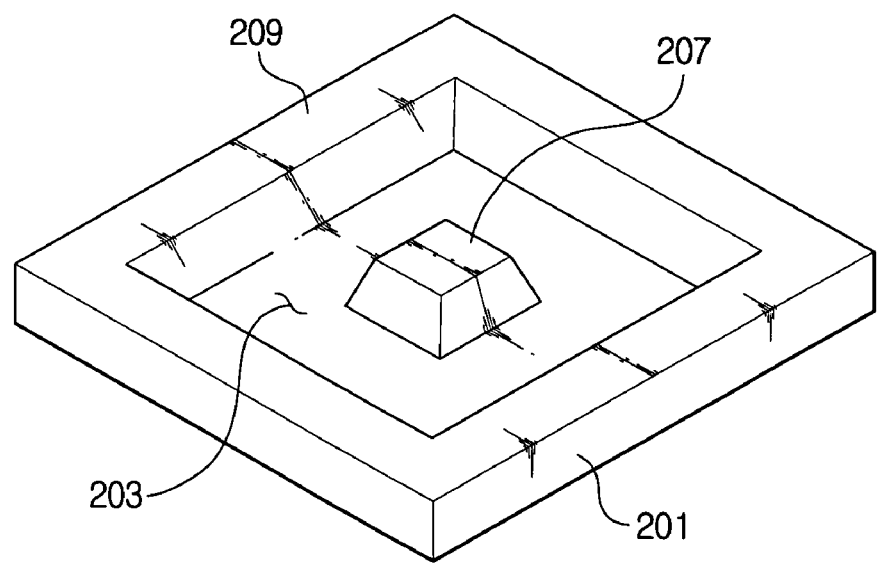
FIG. 4 is a perspective view of a substrate of an inductor fabricated with a DFR and a cavity according to an exemplary embodiment of the present invention.

FIG. 4 is a perspective view of a substrate of the inductor fabricated with a DFR and a cavity according to an exemplary embodiment of the present invention. FIG. 4 illustrates an example of the substrate 201 in which the cavity 203 is formed.

Referring to FIG. 4, a central support part 207 is formed in a center of the substrate 201, and an edge support part 209 is formed at an edge of the substrate 201. The first viahole 211 is formed in an upper portion of the central support part 207 in which an end of the lower electrode 205 is formed, and the second viahole 213 is formed in an upper portion of the edge support part 209 an other end of the lower electrode 205 reaches.

As shown in FIG. 4, the cavity 203 may be formed at least in an area of the substrate 201 opposite to the spiral shape of the first upper electrode 221 and throughout the remaining portion of the substrate 201 except the central support part 207 and the edge support part 209 at the center and the edge of the substrate 201.

The structure of the substrate 201 shown in FIG. 4 is only an example for the inductor 200 according to the present invention. The central support part 207 may not be formed in the center of the substrate 201, and the edge support part 209 may not be formed at the edge of the substrate 201.

The insulating layer 210 may be formed of a DFR to maximize an area and a depth of the cavity 203 without being restricted by a subsequent process. Thus, the cavity 203 may be formed to a depth sufficient enough to form the lower electrode 205. In the inductor 200, the cavity 203 can contribute to securing a space between the first and second electrodes 221 and 223 and the lower electrode 205 so as to minimize a parasitic capacitance. Furthermore, energy loss of the substrate 201 can be minimized. Thus, an inductor having a high quality factor Q and a high SRF can be realized.

FIGS. 5(a) through 5(f) are cross-sectional views illustrating a method of fabricating an inductor having a structure as shown in FIG. 3. The method of fabricating the inductor will now be described with reference to FIGS. 5(a) through 5(f).

Figure 5A:
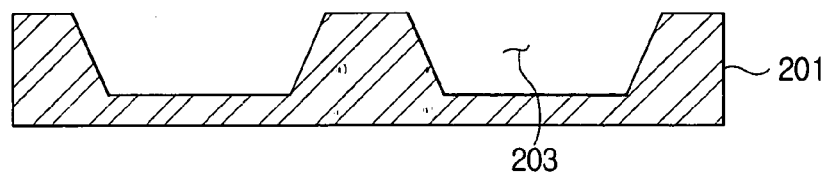
FIGS. 5(a) through 5(f) are cross-sectional views illustrating a method of fabricating an inductor having the structure shown in FIG. 3.

Referring to FIG. 5(a), a cavity 203 is formed in a predetermined area of a substrate 201. The cavity 203 is formed in the remaining area of the substrate 201 except an area of the substrate 201 supporting lower portions of first and second viaholes 211 and 213 and an insulating layer 210 that is to be formed on the substrate 201 as shown in FIG. 4. The cavity 203 may be formed using wet etching using a chemical solution such as an acetic solution, hydrofluoric acid, a phosphoric aqueous solution, or the like or dry etching using a gas, plasma, and an ion beam.

Figure 5B:
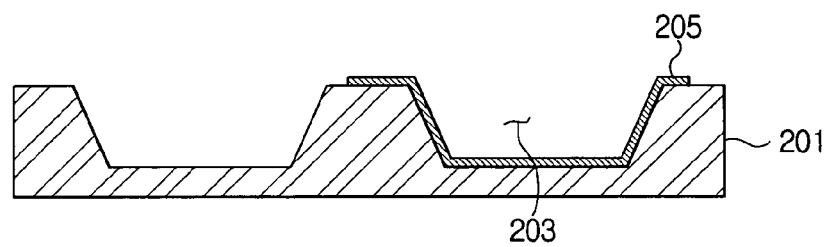

As shown in FIG. 5(b), a lower electrode 205 is formed using a method of depositing a metal layer on the cavity 203 and patterning the metal layer using a photolithography process with a spray coater or a deposition method using a shadow mask so as to range from a central support part 207 to a point of an edge support part 209.

Figure 5C:
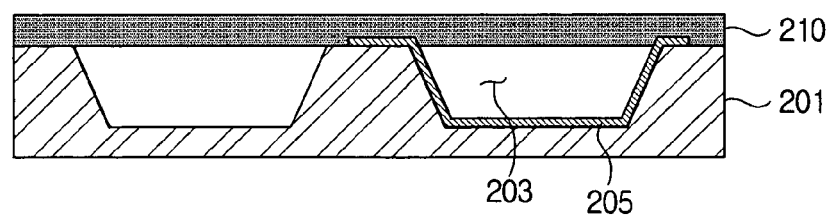

As shown in FIG. 5(c), an insulating layer 210 is formed on the substrate 201 to cover the cavity 203. The insulating layer 210 is formed of a DFR formed using a roller. Also, the insulating layer 210 may be wholly exposed and thermally treated to secure a planarized degree and a structural stability. Thus, a complicated process of filling a cavity with a predetermined material, forming an insulating layer, and removing the predetermined material is not required. As described above, according to another aspect of the present invention, an insulating layer may be further formed of a general insulating material on the insulating layer 210 formed of the DFR.

Figure 5D:
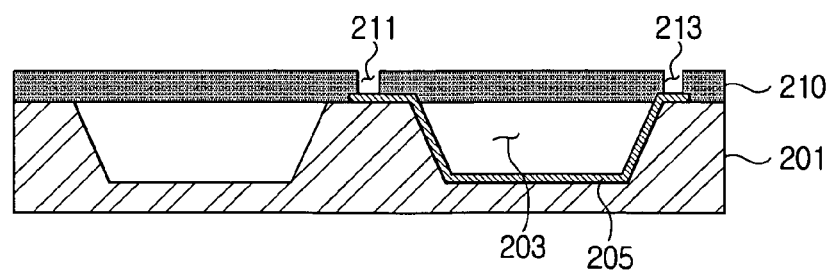

Referring to FIG. 5(d), first and second viaholes 211 and 213 are formed in the insulating layer 210. The first and second viaholes 211 and 213 may be formed by dry etching using a hard mask so as to connect the first electrodes 221 and 223 to the lower electrode 205. Also, in a case where sizes of patterns of the first and second electrodes 221 and 223 are large, the first and second electrodes 221 and 223 may be formed through exposing and developing processes using the photosensitivity of the DFR. In a case where the sizes of the patterns of the first and second electrodes 221 and 223 are relatively small, i.e., widths of the first and second viaholes 211 and 213 are small, the first and second viaholes 211 and 213 may be formed by dry etching.

After the first and second viaholes 211 and 213 are formed in the insulating layer 210, the first and second electrodes 221 and 223 are formed on the insulating layer 210. The first and second electrodes 221 and 223 may be formed using a general metal deposition method. Furthermore, a thick metal layer may be formed using an electro plating process so as to fabricate an inductor having a high quality factor Q.

Figure 5E:
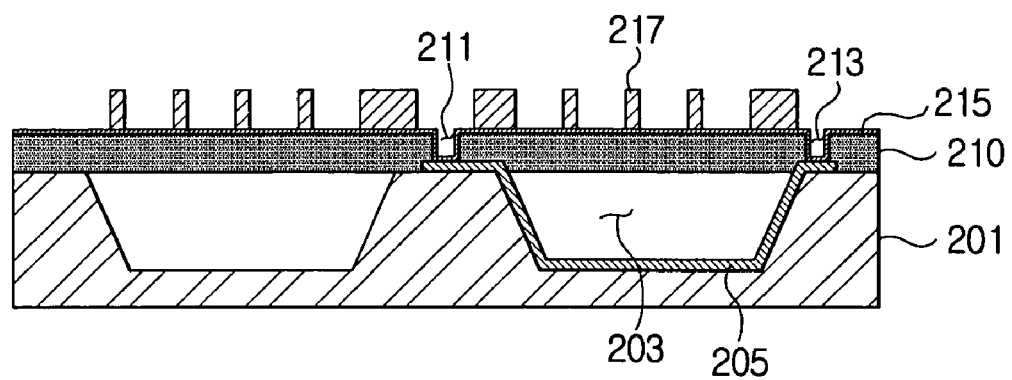
Figure 5F:
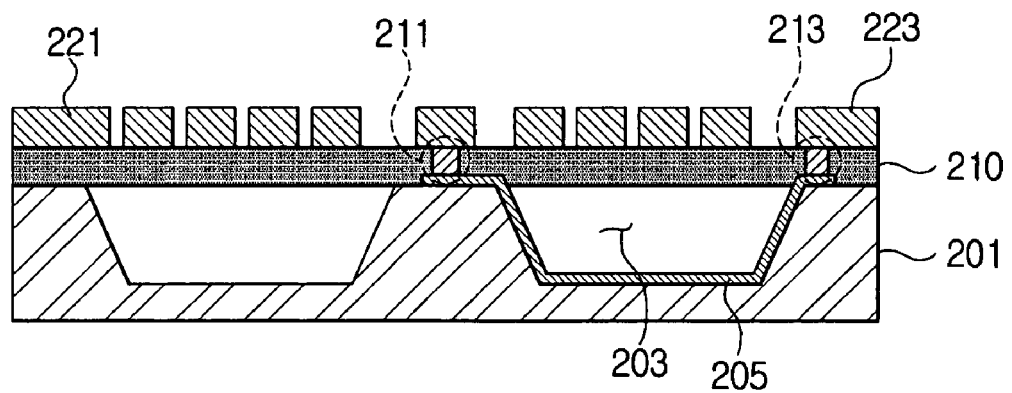

As shown in FIGS. 5(e) and 5(f), the first and second electrodes 221 and 223 are formed using an electro plating process.

Referring to FIG. 5(e), to form the first and second electrodes 221 and 223 using the electro plating process, a plating base layer 215 is deposited on the whole surface of the insulating layer 210, and a plating mold 217 is formed on the remaining portion except a portion of the plating base layer 215 on which the first and second electrodes 221 and 223 are to be formed. A plating mold is not formed in portions in which the first and second viaholes 211 and 213 are formed, so as to connect the first and second electrodes 221 and 223 to the lower electrode 205.

As shown in FIG. 5(f), a plating solution contacts the plating base layer 215 to generate a redox reaction so as to plate metal layers of the first and second electrodes 221 and 223. After the first and second electrodes 221 and 223 are formed, the plating mold 217 is removed. Next, a portion of the plating base layer 215 in which the plating mold 217 was formed is removed so as to complete the inductor 200 of the present invention.

The plating mold 217 and the plating base layer 215 are removed by chemical etching or dry etching using an ion beam.

An inductor according to the present invention can be fabricated with a DFR and a cavity using the above-described method.

As described above, according to the present invention, an inductor having a spiral shape can be fabricated, and a quality factor of the inductor can be improved. Also, a parasitic capacitance component generated by structures of upper electrodes, an insulating layer, and a lower electrode can be removed. As a result, a large capacitance inductor having a high quality factor and a high SRF in high and low frequency bands can be fabricated.

Also, the cavity can be formed in a substrate so as to minimize energy loss caused by an Eddy current formed in the substrate due to the upper electrodes.

The cavity can be covered without a process of filling the cavity with a thick oxide material and performing lapping and CMP with respect to the cavity. Thus, the cavity can be easily planarized. As a result, a process of fabricating the inductor can be simplified.

Furthermore, the cavity can be formed to a depth sufficient enough to form the lower electrode without being restricted by a subsequent process.

The foregoing embodiment and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An inductor comprising:
   a substrate;
   an insulating layer formed on the substrate;
   a first upper electrode formed in a spiral shape on the insulating layer;
   a second upper electrode formed on the insulating layer;
   a cavity formed in an area of the substrate except for portions corresponding to portions of the insulating layer on which one end of the first upper electrode is formed and on which the second upper electrode is formed; and
   a lower electrode formed on an area of the substrate and the cavity, wherein the lower electrode electrically connects the one end of the first upper electrode and the second upper electrode.

2. The inductor of claim 1, wherein the cavity is formed in an area of the substrate opposite to the upper electrodes except a portion in which the at least one viahole is formed.

3. The inductor of claim 1, wherein the insulating layer is a dry film resist.

4. The inductor of claim 3, wherein the insulating layer is strengthened using at least one of whole surface exposure and thermal treating.

5. The inductor of claim 3, wherein the at least one viahole is one of ion beam etched and chemical photolithography etched.

6. The inductor of claim 1, wherein the upper electrodes are one of deposited and etched metal layer and electro plated.

7. The inductor of claim 1, wherein the lower electrode is formed using one of a patterning method using a spray coater and a deposition method using a shadow mask.

8. The inductor of claim 1, wherein the insulating layer covers the cavity.

9. The inductor of claim 1, further comprising;
   a first viahole connecting the one end of the first upper electrode with the lower electrode through the insulating layer; and
   a second viahole connecting the second upper electrode with the lower electrode through the insulating layer.

10. The inductor of claim 1, wherein the first upper electrode is spirally arranged around an axis which is perpendicular to the substrate.

* * * * *